United States Patent
Arai et al.

(10) Patent No.: US 11,634,615 B2
(45) Date of Patent: Apr. 25, 2023

(54) RESIN COMPOSITION

(71) Applicant: NAMICS CORPORATION, Niigata (JP)

(72) Inventors: Fuminori Arai, Niigata (JP); Kazuki Iwaya, Niigata (JP)

(73) Assignee: NAMICS CORPORATION, Niigata (JP)

(*) Notice: Subject to any disclaimer, the term of this patent is extended or adjusted under 35 U.S.C. 154(b) by 711 days.

(21) Appl. No.: 16/614,351

(22) PCT Filed: May 18, 2018

(86) PCT No.: PCT/JP2018/019312
§ 371 (c)(1),
(2) Date: Nov. 15, 2019

(87) PCT Pub. No.: WO2018/212330
PCT Pub. Date: Nov. 22, 2018

(65) Prior Publication Data
US 2020/0148922 A1   May 14, 2020

(30) Foreign Application Priority Data
May 18, 2017  (JP) .............................. JP2017-098918

(51) Int. Cl.
*C09J 129/12*   (2006.01)
*C08K 3/013*    (2018.01)
(Continued)

(52) U.S. Cl.
CPC ............... *C09J 129/12* (2013.01); *C08J 5/18* (2013.01); *C08J 5/249* (2021.05); *C08K 3/013* (2018.01);
(Continued)

(58) Field of Classification Search
CPC .................................. C09J 4/00; C09J 129/12
See application file for complete search history.

(56) References Cited

U.S. PATENT DOCUMENTS 2,330,033 A   9/1943   D'Alelio
3,523,097 A   8/1970   Coover et al.
(Continued)

FOREIGN PATENT DOCUMENTS

JP   S5037169 B1   12/1975
JP   2014503474 A   2/2014
(Continued)

OTHER PUBLICATIONS

Chemillian(TM) L3000 XP Safety Data Sheet, Sirrus Chemistry, Jan. 7, 2019, pp. 1-6.
(Continued)

*Primary Examiner* — Rip A Lee
(74) *Attorney, Agent, or Firm* — Holtz, Holtz & Volek PC

(57) ABSTRACT

A resin composition contains one or more 2-methylene-1,3-dicarbonyl compounds. At least one of the one or more 2-methylene-1,3-dicarbonyl compounds has a molecular weight of 220 to 10,000, and the amount by weight of those of the 2-methylene-1,3-dicarbonyl compounds having a molecular weight of less than 220 relative the entire resin composition of 1 is 0.00 to 0.05. The 2-methylene-1,3-dicarbonyl compounds contain a structural unit represented by formula (I) below.

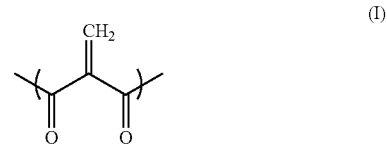

(I)

19 Claims, 1 Drawing Sheet

(51) Int. Cl.
  *C08J 5/18* (2006.01)
  *C08K 5/00* (2006.01)
  *C08K 5/17* (2006.01)
  *H01L 23/10* (2006.01)
  *C08J 5/24* (2006.01)

(52) U.S. Cl.
  CPC ............... *C08K 5/005* (2013.01); *C08K 5/17* (2013.01); *H01L 23/10* (2013.01); *C08J 2329/12* (2013.01)

(56) References Cited

U.S. PATENT DOCUMENTS

| | | | |
|---|---|---|---|
| 3,758,550 | A | 9/1973 | Eck et al. |
| 8,609,885 | B2 | 12/2013 | Malofsky et al. |
| 8,884,051 | B2 | 11/2014 | Malofsky et al. |
| 9,181,365 | B2* | 11/2015 | Malofsky ............... C08F 22/14 |
| 9,217,098 | B1* | 12/2015 | Stevenson ............... C08F 2/58 |
| 9,249,265 | B1* | 2/2016 | Stevenson ............. C08F 222/14 |
| 9,279,022 | B1* | 3/2016 | Palsule ..................... C08F 2/06 |
| 9,334,430 | B1* | 5/2016 | Stevenson ............... C08L 27/06 |
| 9,416,091 | B1* | 8/2016 | Sullivan ................ C07C 69/732 |
| 9,512,058 | B2* | 12/2016 | Malofsky ................ C07C 67/03 |
| 9,567,475 | B1* | 2/2017 | Palsule ................... C08G 63/78 |
| 9,617,377 | B1 | 4/2017 | Palsule et al. |
| 9,752,059 | B2* | 9/2017 | Malofsky ................... C09J 4/00 |
| 10,047,192 | B2* | 8/2018 | Ellison ................. C07C 69/708 |
| 10,607,910 | B2* | 3/2020 | Malofsky .......... H01L 23/49811 |
| 11,230,617 | B2* | 1/2022 | Arai ........................... C09J 4/00 |
| 2013/0281580 | A1 | 10/2013 | Malofsky et al. |
| 2013/0303719 | A1 | 11/2013 | Malofsky et al. |
| 2014/0248485 | A1 | 9/2014 | Malofsky et al. |
| 2014/0329980 | A1 | 11/2014 | Malofsky et al. |
| 2015/0056879 | A1* | 2/2015 | Malofsky ................ B32B 15/20 524/508 |
| 2015/0073110 | A1 | 3/2015 | Malofsky et al. |
| 2015/0210894 | A1* | 7/2015 | Malofsky .................. B32B 7/12 156/308.6 |
| 2015/0303122 | A1 | 10/2015 | Malofsky et al. |
| 2016/0068621 | A1 | 3/2016 | Sullivan et al. |
| 2017/0050914 | A1 | 2/2017 | Malofsky et al. |
| 2020/0317827 | A1* | 10/2020 | Holzer ..................... C08K 5/55 |

FOREIGN PATENT DOCUMENTS

| | | |
|---|---|---|
| JP | 2015512460 A | 4/2015 |
| JP | 2015517973 A | 6/2015 |
| JP | 2015518503 A | 7/2015 |
| JP | 2016506072 A | 2/2016 |
| JP | 2017036361 A | 2/2017 |
| WO | 2012054633 A2 | 4/2012 |
| WO | 2014078689 A1 | 5/2014 |
| WO | 2014085570 A1 | 6/2014 |
| WO | 2016205605 A1 | 12/2016 |

OTHER PUBLICATIONS

Decision on Written Opposition dated Oct. 25, 2019 (and English translation thereof) issued in Japanese Patent No. 6427848.
Third Party Observation dated Jan. 21, 2020 filed in European Application No. EP 18803230.4.
Third Party Observation dated Jun. 14, 2019 filed in International Application No. PCT/JP2018/019312.
Written Opposition filed in the Japanese Patent Office (JPO) dated May 28, 2019 against Japanese Patent No. 6427848.
Sherwood, "Nine Simple Steps to Control Blooming of Adhesives", Design World Online, Sep. 17, 2013, retrieved online: <https://www.designworldonline.com/nine-simple-steps-control-blooming-adhesives/>.
Stevenson, et al., "Methylene Malonates and Cyanoacrylates: Energy Efficient, High-Performance Sustainable Adhesive Systems", Forest Products Journal, 2015, vol. 65, No. 1-2, pp. 48-53 (Abstract only).
International Search Report (ISR) dated Aug. 14, 2018 (and English translation thereof), issued in International Application No. PCT/JP2018/019312.
Japanese Office Action dated Jan. 9, 2018 (and English translation thereof) issued in Japanese Patent Application No. 2017-201089.
Written Opinion of the International Searching Authority dated Aug. 14, 2018 issued in International Application No. PCT/JP2018/019312.
De Keyser, et al., "A Versatile and Convenient Multigram Synthesis of Mehtylidenemalonic Acid Diesters", Journal of Organic Chemistry, vol. 53, No. 20, 1988, pp. 4859-4862.
U.S. Appl. No. 16/759,886; First Named Inventor: Fuminori Arai; Title: "Resin Composition"; filed Apr. 28, 2020.
Extended European Search Report (EESR) dated Feb. 10, 2021 issued in European Application No. 18803230.4.

\* cited by examiner

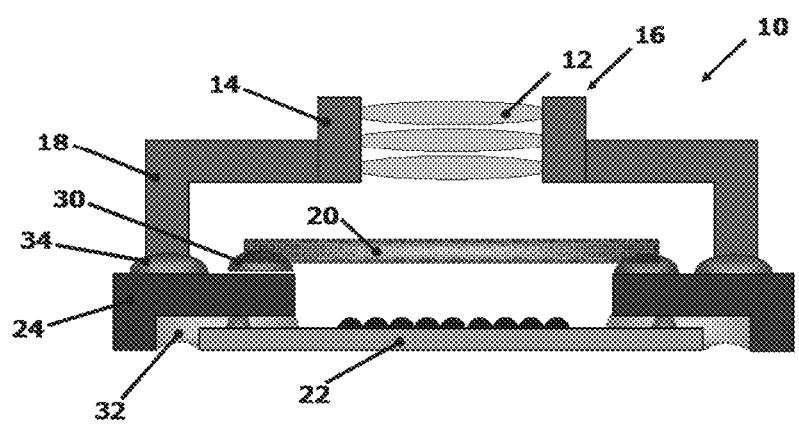

RESIN COMPOSITION

TECHNICAL FIELD

The present invention relates to a resin composition suitable for a one-part adhesive for use in applications requiring thermal curing at low temperatures, desirably thermal curing at normal temperature. The resin composition of the present invention is suitable as a one-part adhesive used in the manufacture of an image sensor module used as a camera module for a cellular phone or a smart phone as well as electronic components such as semiconductor elements, integrated circuits, large-scale integrated circuits, transistors, thyristors, diodes, capacitors, etc. Also, it is hoped that the resin composition of the present invention will find application as a liquid sealing material used in the manufacture of a semiconductor device, an interlayer adhesive film, a prepreg, and the like.

BACKGROUND ART

In the manufacture of an image sensor module used as a camera module for a cellular phone or a smart phone, a one-part adhesive that is thermally curable at as low a temperature as possible is used. In the manufacture of electronic components such as semiconductor devices, integrated circuits, large-scale integrated circuits, transistors, thyristors, diodes, capacitors, etc., it is also preferable to use a one-part adhesive that is thermally curable at as low a temperature as possible. There is a need for one-part adhesives that can be cured at even lower temperatures to avoid heat-induced deterioration in the characteristics of neighboring components, as well as to improve manufacturing efficiency.

In addition, another important characteristic requirement for a one-part adhesive used in the manufacture of an image sensor module and other electronic components is that the amounts of components that volatilize during use (application) or curing be small.

If a one-part adhesive contains large amounts of components that volatilize during use or curing at normal temperature, particularly when used for electronic components such as a camera/sensor module, the volatilized substances may adhere to sensors, lenses, electrodes, and the like, thereby causing contamination of the sensors, lenses, electrodes, and the like. Typically, in a module manufacturing process, the contaminations generated in the process are often removed by cleaning with a solvent. If the adhered substance is in a liquid state, such cleaning can remove the contaminations relatively easily, but if it is a solid substance cured on components, it is difficult to remove it from the components, which raises concerns about increased production costs caused by a decrease in yield etc. Also, the generation of bubbles in the cured product due to volatilized substances may lead to a decreased adhesion strength as a result of a decrease in bulk strength or a reduction in the area of the adherend interface. If bubbles are generated at the time of curing, it may compromise reliability through a decrease in the positional accuracy of the adherend due to deformation. Furthermore, if there are large amounts of volatile components, it gives rise to concerns about health effects such as irritation to the eyes, the bronchi, and the like, and may cause a deterioration of the working environment.

Conventionally known one-part adhesives for use in an electronic component such as an image sensor module include thiol-based adhesives comprising an epoxy resin, a polythiol compound, and a curing accelerator as essential components, and acrylate resin-based adhesives comprising a radical initiator or an anion initiator as an essential component, and some of these adhesives are known to be curable at about 80° C. However, there is a need for one-part adhesives that are curable at even lower temperatures in order to improve manufacturing efficiency.

Patent Document 1 discloses a resin composition comprising diethyl methylene malonate (DEtMM) that can be cured in a short time even at low temperatures such as room temperature. Further, this document teaches that if the substrate has chemically basic attributes, the resin composition can be cured by the bases on the surface of the substrate even if the resin composition does not comprise a catalyst. However, the resin composition of Patent Document 1 has a large amount of components that volatilize during use or curing at room temperature, and there is concern that, particularly when used for an electronic component such as an image sensor module, this can cause the issues discussed above such as adhesion to, and contamination of, sensors, lenses, electrodes, and the like, as well as deterioration of the working environment and compromised reliability.

PRIOR ART DOCUMENTS

Patent Documents

Patent Document 1: Japanese Translation of PCT International Application Publication No. JP-T-2016-506072

SUMMARY OF THE INVENTION

Problems to be Solved by the Invention

It is an object of the present invention to provide a resin composition curable at a low temperature of 80° C. or lower, preferably at room temperature, and comprising only a small amount of components that volatilize during use (application) or curing and that is suitable as a one-part adhesive for use in the manufacture of an image sensor module or an electronic component, in order to solve the problems of the prior art discussed above.

Solution to the Problems

As a result of intensive research to solve the above-mentioned problems, the present inventor has arrived at the present invention.

That is, the present invention includes, but is not limited to, the following inventions.

(1)

A resin composition comprising one or more 2-methylene-1,3-dicarbonyl compounds, wherein at least one of the one or more 2-methylene-1,3-dicarbonyl compounds has a molecular weight of 220 to 10,000;

the amount by weight of those of the 2-methylene-1,3-dicarbonyl compounds having a molecular weight of less than 220 relative to the entire resin composition of 1 is 0.00 to 0.05; and the 2-methylene-1,3-dicarbonyl compounds comprise a structural unit represented by formula (I) below.

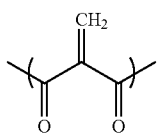

(2) The resin composition according to preceding item (1), substantially free of any 2-methylene-1,3-dicarbonyl compounds having a molecular weight of less than 220.

(3) The resin composition according to preceding item (1) or (2), comprising at least one 2-methylene-1,3-dicarbonyl compound comprising two or more structural units represented by formula (I) above.

(4) The resin composition according to preceding item (3), further comprising at least one 2-methylene-1,3-dicarbonyl compound having only one structural unit represented by formula (I) above.

The resin composition according to preceding item (3), wherein the amount by weight of the at least one 2-methylene-1,3-dicarbonyl compound comprising two or more structural units represented by formula (I) above relative to the entire resin composition of 1 is 0.05 to 0.95.

(6) The resin composition according to any one of preceding items (1) to (5), wherein the 2-methylene-1,3-dicarbonyl compounds are represented by formula (II) below:

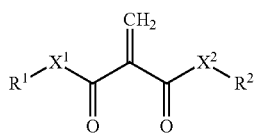

wherein
$X^1$ and $X^2$ each, independently, represent a single bond, O or $NR^3$, wherein $R^3$ represents hydrogen or a monovalent hydrocarbon group; and
$R^1$ and $R^2$ are each, independently, hydrogen, a monovalent hydrocarbon group, or represented by formula (III) below:

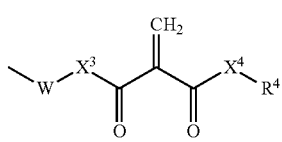

wherein
$X^3$ and $X^4$ each, independently, represent a single bond, O or $NR^5$, wherein $R^5$ represents hydrogen or a monovalent hydrocarbon group;
W represents a spacer; and
$R^4$ represents hydrogen or a monovalent hydrocarbon group.

(7) The resin composition according to any one of preceding items (1) to (6), further comprising (A) an inorganic filler.

(8) The resin composition according to any one of preceding items (1) to (7), further comprising (B) a curing catalyst.

(9) The resin composition according to any one of preceding items (1) to (8), further comprising (C) a stabilizer.

(10) The resin composition according to any one of preceding items (1) to (9), wherein the amount by weight of the 2-methylene-1,3-dicarbonyl compounds relative to the entire resin composition is 0.01 to 1.00.

(11) The resin composition according to any one of preceding items (1) to (10), wherein the amount by weight of those of the 2-methylene-1,3-dicarbonyl compounds having a vapor pressure of 0.01 mmHg or more at 25° C. relative to the entire resin composition of 1 is 0.00 to 0.05.

(12) The resin composition according to any one of preceding items (1) to (11), curable by heat.

(13) The resin composition according to any one of preceding items (1) to (12), wherein the amount by weight of those of the 2-methylene-1,3-dicarbonyl compounds having a molecular weight of less than 220 relative to the totality of the 2-methylene-1,3-dicarbonyl compounds of 1 is 0.00 to 0.05.

(14) The resin composition according to any one of preceding items (1) to (13), wherein the amount by weight of those of the 2-methylene-1,3-dicarbonyl compounds comprising two or more structural units represented by formula (I) above relative to the totality of the 2-methylene-1,3-dicarbonyl compounds of 1 is 0.05 to 0.95.

(15) A cured product obtained by curing the resin composition according to any one of preceding items (1) to (14).

(16) An adhesive or sealing material comprising the resin composition according to any one of preceding items (1) to (14).

(17) The adhesive or sealing material according to preceding item (16) for an electronic component.

(18) A film or prepreg comprising the resin composition according to any one of preceding items (1) to (14).

(19) The film or prepreg according to preceding item (18) for an electronic component.

(20) A semiconductor device comprising the cured product according to preceding item (15), a cured product of the adhesive or sealing material according to preceding item (17), or a cured product of the film or prepreg according to preceding item (19).

(21) A method for producing a semiconductor device having an electronic component and a circuit board, the method comprising:
providing an electronic component and a circuit board;
applying the resin composition according to any one of preceding items (1) to (14) to the surface of the electronic component or the circuit board; and
contacting the electronic component and the circuit board.

(22)

A method for producing a sealed electronic component, comprising:

providing an electronic component; and sealing the electronic component using the resin composition according to any one of preceding items (1) to (14).

(23)

A method for producing an electronic component, comprising:

providing a plurality of members to be incorporated in an electronic component;

applying the resin composition according to any one of preceding items (1) to (14) to the surface of a member to be incorporated in the electronic component; and contacting the member with another member to be incorporated in the electronic component.

(24)

A method for producing a member to be incorporated in an electronic component, comprising:

providing a circuit board comprising an electronic circuit; and applying the resin composition according to any one of preceding items (1) to (14) onto the electronic circuit on the circuit board.

(101)

A resin composition comprising one or more 2-methylene-1,3-dicarbonyl compounds, wherein at least one of the one or more 2-methylene-1,3-dicarbonyl compounds has a molecular weight of 220 to 10,000;

the amount by weight of those of the 2-methylene-1,3-dicarbonyl compounds having a molecular weight of less than 220 relative to the totality of the 2-methylene-1,3-dicarbonyl compounds of 1 is 0.00 to 0.05; and the 2-methylene-1,3-dicarbonyl compounds comprise a structural unit represented by formula (I) below.

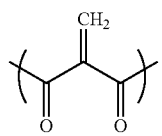
(I)

(102)

The resin composition according to preceding item (101), substantially free of any 2-methylene-1,3-dicarbonyl compounds having a molecular weight of less than 220.

(103)

The resin composition according to preceding item (101) or (102), comprising at least one 2-methylene-1,3-dicarbonyl compound comprising two or more structural units represented by formula (I) above.

(104)

The resin composition according to preceding item (103), wherein the amount by weight of the at least one 2-methylene-1,3-dicarbonyl compound comprising two or more structural units represented by formula (I) above relative to the totality of the 2-methylene-1,3-dicarbonyl compounds of 1 is 0.05 to 0.95.

(105)

The resin composition according to any one of preceding items (101) to (104), wherein the 2-methylene-1,3-dicarbonyl compounds are represented by formula (II) below:

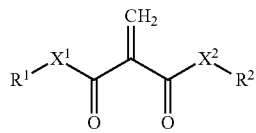
(II)

wherein $X^1$ and $X^2$ each, independently, represent a single bond, O or $NR^3$, wherein $R^3$ represents hydrogen or a monovalent hydrocarbon group; and $R^1$ and $R^2$ are each, independently, hydrogen, a monovalent hydrocarbon group, or represented by formula (III) below:

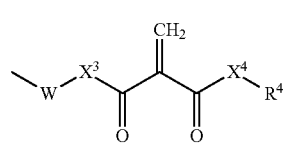
(III)

wherein $X^3$ and $X^4$ each, independently, represent a single bond, O or $NR^5$, wherein $R^5$ represents hydrogen or a monovalent hydrocarbon group;

W represents a spacer; and $R^4$ represents hydrogen or a monovalent hydrocarbon group.

(106)

The resin composition according to any one of preceding items (101) to (105), further comprising (A) an inorganic filler.

(107)

The resin composition according to any one of preceding items (101) to (106), further comprising (B) a curing catalyst.

(108)

The resin composition according to any one of preceding items (101) to (107), further comprising (C) a stabilizer.

(109)

The resin composition according to any one of preceding items (101) to (108), wherein the amount by weight of the 2-methylene-1,3-dicarbonyl compounds relative to the entire resin composition is 0.01 to 1.00.

(110)

The resin composition according to any one of preceding items (101) to (109), wherein the amount by weight of those of the 2-methylene-1,3-dicarbonyl compounds having a vapor pressure of 0.01 mmHg or more at 25° C. relative to the totality of the 2-methylene-1,3-dicarbonyl compounds of 1 is 0.00 to 0.05.

(111)

The resin composition according to any one of preceding items (101) to (110), curable by heat.

(112)

A cured product obtained by curing the resin composition according to any one of preceding items (101) to (111).

(113)

An adhesive or sealing material comprising the resin composition according to any one of preceding items (101) to (111).

(114)

The adhesive or sealing material according to preceding item (113) for an electronic component.

(115)

A film or prepreg comprising the resin composition according to any one of preceding items (101) to (111).

(116)

The film or prepreg according to preceding item (115) for an electronic component.

(117)

A semiconductor device comprising the cured product according to preceding item (112), a cured product of the adhesive or sealing material according to preceding item (114), or a cured product of the film or prepreg according to preceding item (116).

EFFECT OF THE INVENTION

It is contemplated that the resin composition of the present invention can be cured in a short time at a low temperature of 80° C. or lower, or even at room temperature, because the resin composition comprises a 2-methylene-1,3-dicarbonyl compound, which has high reactivity due to its chemical structure. As described above, the resin composition of the present invention can be thermally cured in a short time at a low temperature of 80° C. or lower, preferably at room temperature and has only a small amount of low molecular weight monomer components that may volatilize during use (application) or curing, and therefore is suitable as a one-part adhesive used in the manufacture of an image sensor module or an electronic component. Such characteristics make it possible to improve efficiency in manufacturing electronic components and, at the same time, to reduce contamination of neighboring components during use or curing, thereby maintaining a good working environment, and to ensure high reliability of the cured product.

The resin composition of the present invention is particularly useful for the purposes of thermal curing, but even when light, electromagnetic waves, ultrasonic waves, physical shear, or the like are used as the means of curing, the resin composition is able to lessen concerns such as volatilization at room temperature or volatilization due to reaction heat, and therefore is useful.

BRIEF DESCRIPTION OF THE DRAWINGS

FIG. 1 is a gross-sectional view of a camera module.

DESCRIPTION OF EMBODIMENTS

Embodiments of the prevent invention are described in detail below.

2-Methylene-1,3-dicarbonyl Compound

The 2-methylene-1,3-dicarbonyl compound of the present invention is a compound comprising a structural unit represented by formula (I) below.

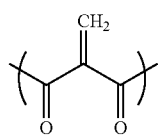
(I)

The 2-methylene-1,3-dicarbonyl compound comprises one or more structural units of formula (I) above. In some embodiments, the 2-methylene-1,3-dicarbonyl compound comprises two or three, preferably two, structural units of formula (I) above.

Since the 2-methylene-1,3-dicarbonyl compound comprises the structural unit of formula (I) above, it is polymerized by Michael addition, typically in the presence of a base catalyst, and therefore can be used as a main component of a one-part adhesive. If the 2-methylene-1,3-dicarbonyl compound comprises two or more structural units of formula (I) above (polyfunctional), cross-links are generated during curing, and this is expected to result in improvement in physical properties such as enhanced mechanical properties of the cured product at high temperatures.

The resin composition of the present invention comprises one or more types, preferably two or more types, of 2-methylene-1,3-dicarbonyl compounds. At least one of the 2-methylene-1,3-dicarbonyl compounds contained in the resin composition of the present invention has a molecular weight of 220 to 10,000, more preferably 220 to 5,000, even more preferably 220 to 2,000, and most preferably 220 to 1,000. The molecular weight of each 2-methylene-1,3-dicarbonyl compound contained in the resin composition and the amount by weight of each 2-methylene-1,3-dicarbonyl compound contained in the resin composition, when the entire resin composition or the totality of the 2-methylene-1,3-dicarbonyl compounds in the resin composition is taken as 1, are revealed, for example, by means of reverse phase high performance liquid chromatography (reverse phase HPLC) using an ODS column for the column and a mass spectrometer (MS) for the detector with PDA (detection wavelength: 190 nm to 800 nm) or ELSD quantification. If the molecular weight of the 2-methylene-1,3-dicarbonyl compound is less than 220, its vapor pressure at 25° C. may be too high. By contrast, if the molecular weight of the 2-methylene-1,3-dicarbonyl compound exceeds 10,000, it results in an excessively high viscosity of the resin composition, which decreases workability and also causes other issues such as imposing limitations on the amount of fillers that can be added.

The resin composition of the present invention preferably comprises a multifunctional component for greater heat resistance of the cured product. Polyfunctionality herein means that the 2-methylene-1,3-dicarbonyl compound comprises two or more structural units of formula (I) above. The number of structural units of formula (I) in a 2-methylene-1,3-dicarbonyl compound is referred to as the "number of functional groups" of the 2-methylene-1,3-dicarbonyl compound. Of the 2-methylene-1,3-dicarbonyl compounds, those for which the number of functional groups is one are called "monofunctional"; those for which the number of functional groups is two are called "bifunctional"; and those for which the number of functional groups is three are called "trifunctional."

The resin composition of the present invention preferably does not comprise an ester structure for greater moisture resistance reliability of the cured product. If the resin composition of the present invention comprises a multifunctional component, a network-like cross-linked structure is formed in the cured product, with the result that the cured product does not flow and maintains a constant storage modulus even at high temperatures, in particular, at temperatures equal to or higher than its glass transition temperature. The storage modulus of the cured product at high temperatures can be measured, for example, by dynamic mechanical analysis (DMA). Typically, if a cured product having a cross-linked structure formed therein is measured by DMA, a region known as a plateau is observed over a wide temperature range above its glass transition temperature over which changes in storage modulus are relatively small as the temperature changes. The storage modulus in this plateau region is evaluated as a quantity related to crosslink density, i.e., the proportion of the polyfunctional components in the resin composition.

In an embodiment of the present invention, the amount by weight of the 2-methylene-1,3-dicarbonyl compound(s) having a molecular weight of 220 or more is preferably 0.01 to 1.00, more preferably 0.05 to 1.00, relative to the entire resin composition of 1.

In an embodiment of the present invention, the resin composition may comprise a 2-methylene-1,3-dicarbonyl compound having a molecular weight of less than 220. The amount by weight of the 2-methylene-1,3-dicarbonyl compound(s) having a molecular weight of less than 220 is preferably 0.00 to 0.05, more preferably 0.00 to 0.03, and even more preferably 0.00 to 0.02, relative to the entire resin composition of the present invention of 1. Most preferably, the resin composition of the present invention is substantially free of any 2-methylene-1,3-dicarbonyl compound having a molecular weight of less than 220. "Substantially free" here means that the amount by weight of the 2-methylene-1,3-dicarbonyl compound(s) having a molecular weight of less than 220 is 0.00 to 0.01, preferably 0.00 to 0.001, relative to the entire resin composition of the present invention of 1. The higher the proportion of the 2-methylene-1,3-dicarbonyl compound(s) having a relatively small molecular weight, the more concern there is not only about the contamination of neighboring components but also about deterioration of the working environment, impairment of physical properties of the cured product, a decreased strength of adhesion to the adherent material and the like. Such concern arises from the peculiarly high polymerization reactivity exhibited by the 2-methylene-1,3-dicarbonyl compound.

In another embodiment of the present invention, the amount by weight of the 2-methylene-1,3-dicarbonyl compound(s) having a molecular weight of 220 or more is preferably 0.01 to 1.00, more preferably 0.05 to 1.00, relative to the totality of the 2-methylene-1,3-dicarbonyl compounds contained in the resin composition of 1.

In another embodiment of the present invention, the resin composition may comprise a 2-methylene-1,3-dicarbonyl compound having a molecular weight of less than 220. The amount by weight of the 2-methylene-1,3-dicarbonyl compound(s) having a molecular weight of less than 220 is preferably 0.00 to 0.05, more preferably 0.00 to 0.03, and even more preferably 0.00 to 0.02, relative to the totality of the 2-methylene-1,3-dicarbonyl compounds contained in the resin composition of 1. Most preferably, the resin composition of the present invention is substantially free of any 2-methylene-1,3-dicarbonyl compound having a molecular weight of less than 220. "Substantially free" here means that the amount by weight of the 2-methylene-1,3-dicarbonyl compound(s) having a molecular weight of less than 220 is 0.00 to 0.01, preferably 0.00 to 0.001, relative to the totality of the 2-methylene-1,3-dicarbonyl compounds contained in the resin composition of 1. The higher the proportion of the 2-methylene-1,3-dicarbonyl compound(s) having a relatively small molecular weight, the more concern there is not only about the contamination of neighboring components but also about deterioration of the working environment, impairment of physical properties of the cured product, a decreased strength of adhesion to the adherent material and the like. Such concern arises from the peculiarly high polymerization reactivity exhibited by the 2-methylene-1,3-dicarbonyl compound.

The resin composition of the present invention may comprise at least one 2-methylene-1,3-dicarbonyl compound comprising two or more structural units represented by formula (I) above. In an embodiment, the resin composition of the present invention may comprise at least one 2-methylene-1,3-dicarbonyl compound comprising two or more structural units represented by formula (I) above, and at least one 2-methylene-1,3-dicarbonyl compound having only one structural unit represented by formula (I) above.

In an embodiment, the amount by weight of the 2-methylene-1,3-dicarbonyl compound(s) comprising two or more structural units represented by formula (I) above is preferably 0.01 to 1.00, more preferably 0.05 to 0.95, even more preferably 0.05 to 0.90, particularly preferably 0.10 to 0.90, and most preferably 0.20 to 0.80, relative to the entire resin composition of the present invention of 1. In another embodiment, the amount by weight of the 2-methylene-1,3-dicarbonyl compound(s) comprising two or more structural units represented by formula (I) above is 0.00 to 0.10, preferably 0.01 to 0.10, relative to the entire resin composition of the present invention of 1. If the amount by weight of the 2-methylene-1,3-dicarbonyl compound(s) comprising two or more structural units represented by formula (I) above is 0.01 or more, relative to the entire resin composition of the present invention of 1, sufficient crosslinking is expected to be formed during curing, resulting in the cured product having favorable mechanical properties at high temperatures (at the softening point or higher).

In another embodiment, the amount by weight of the 2-methylene-1,3-dicarbonyl compound(s) comprising two or more structural units represented by formula (I) above is preferably 0.01 to 1.00, more preferably 0.05 to 0.95, even more preferably 0.05 to 0.90, particularly preferably 0.10 to 0.90, and most preferably 0.20 to 0.80, relative to the totality of the 2-methylene-1,3-dicarbonyl compounds contained in the resin composition of the present invention of 1. In a further alternative embodiment, the amount by weight of the 2-methylene-1,3-dicarbonyl compound(s) comprising two or more structural units represented by formula (I) above is 0.00 to 0.10, preferably 0.01 to 0.10, relative to the totality of the 2-methylene-1,3-dicarbonyl compounds contained in the resin composition of the present invention of 1. If the amount by weight of the 2-methylene-1,3-dicarbonyl compound(s) comprising two or more structural units represented by formula (I) above is 0.01 or more, relative to the totality of the 2-methylene-1,3-dicarbonyl compounds contained in the resin composition of the present invention of 1, sufficient crosslinking is expected to be formed during curing, resulting in the cured product having favorable mechanical properties at high temperatures (at the softening point or higher).

The weight ratio of the 2-methylene-1,3-dicarbonyl compounds in the resin composition of the present invention to the entire resin composition is 0.01 to 1.00, more preferably 0.10 to 1.00, and even more preferably 0.20 to 1.00. If the weight ratio of the 2-methylene-1,3-dicarbonyl compounds contained in the resin composition of the present invention to the entire resin composition is less than 0.1, it is feared that the 2-methylene-1,3-dicarbonyl compounds may not be able to spread over the entire resin composition, resulting in uneven curing. The weight ratio of the 2-methylene-1,3-dicarbonyl compounds contained in the entire resin composition can be ascertained by, for example, separating solids and liquids by extraction or the like, followed by quantification by reverse phase HPLC as described above.

In an embodiment, the 2-methylene-1,3-dicarbonyl compound is represented by formula (II) below:

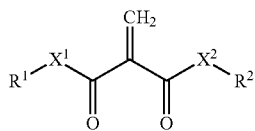

(II)

wherein $X^1$ and $X^2$ each, independently, represent a single bond, O or $NR^3$, wherein $R^3$ represents hydrogen or a monovalent hydrocarbon group; and $R^1$ and $R^2$ are each, independently, hydrogen, a monovalent hydrocarbon group, or represented by formula (III) below:

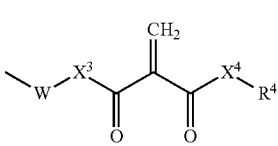

(III)

wherein $X^3$ and $X^4$ each, independently, represent a single bond, O or $NR^5$, wherein $R^5$ represents hydrogen or a monovalent hydrocarbon group;

W represents a spacer; and $R^4$ represents hydrogen or a monovalent hydrocarbon group.

In an embodiment, the 2-methylene-1,3-dicarbonyl compound is represented by formula (IV) below:

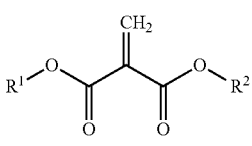

(IV)

wherein $R^1$ and $R^2$ are each, independently, hydrogen, a monovalent hydrocarbon group, or represented by formula (V) below:

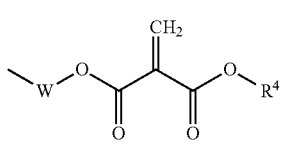

(V)

wherein

W represents a spacer; and $R^4$ represents hydrogen or a monovalent hydrocarbon group.

In another embodiment, the 2-methylene-1,3-dicarbonyl compound is a dicarbonylethylene derivative represented by formula (VI) below:

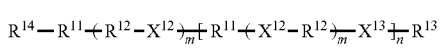

(VI)

wherein $R^{11}$ represents a 1,1-dicarbonylethylene unit represented by formula (VII) below:

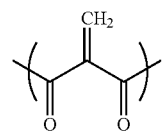

(VII)

each $R^{12}$ each, independently, represents a spacer;

$R^{13}$ and $R^{14}$ each, independently, represent hydrogen or a monovalent hydrocarbon group;

$X^{11}$ and each $X^{12}$ and $X^{13}$ each, independently, represent a single bond, O or $NR^{15}$, wherein $R^{15}$ represents hydrogen or a monovalent hydrocarbon group;

each m each, independently, represents 0 or 1; and n represents an integer of 1 or more and 20 or less;

As used herein, a monovalent hydrocarbon group refers to the group that results if one hydrogen atom is removed from a carbon atom in a hydrocarbon. Examples of the monovalent hydrocarbon group include an alkyl group, an alkenyl group, an alkynyl group, a cycloalkyl group, an alkyl-substituted cycloalkyl group, an aryl group, an aralkyl group, and an alkaryl group, and some of these may comprise heteroatoms such as N, O, S, P and Si.

The monovalent hydrocarbon groups above may be each substituted with alkyl, cycloalkyl, heterocyclyl, aryl, heteroaryl, allyl, alkoxy, alkylthio, hydroxyl, nitro, amide, azide, cyano, acyloxy, carboxy, sulfoxy, acryloxy, siloxy, epoxy, or ester.

The monovalent hydrocarbon group is preferably an alkyl group or an alkyl group substituted with a hydroxy group, and more preferably an alkyl group.

There are no particular restrictions on the carbon number of the alkyl group, alkenyl group, and alkynyl group (hereinafter collectively referred to as the "alkyl group etc."). The carbon number of the alkyl group is usually 1 to 12, preferably 2 to 10, more preferably 3 to 8, even more preferably 4 to 7, particularly preferably 5 to 6. The carbon number of the alkenyl group and the alkynyl group is usually from 2 to 12, preferably from 2 to 10, more preferably from 3 to 8, even more preferably from 3 to 7, and particularly preferably from 3 to 6. If the alkyl group etc. have a cyclic structure, the number of carbon atoms in the alkyl group etc. is usually 4 to 12, preferably 4 to 10, more preferably 5 to 8, even more preferably 6 to 8. The carbon number of the alkyl group etc. can be identified by, for example, reverse phase HPLC, described above, or nuclear magnetic resonance (NMR).

There are no particular restrictions on the structure of the alkyl group etc. The alkyl group etc. may be linear or may have a side chain. The alkyl group etc. may have a chain structure or a cyclic structure (a cycloalkyl group, a cycloalkenyl group, and a cycloalkynyl group). The alkyl group etc. may have one or more other substituents. For example, the alkyl group etc. may have a substituent comprising an atom other than a carbon atom or a hydrogen atom as a substituent. Also, the alkyl group etc. may comprise one or more atoms other than a carbon atom or a hydrogen atom in a chain structure or a cyclic structure. Examples of the atoms other than a carbon atom or a hydrogen atom above include one or more of an oxygen atom, a nitrogen atom, a sulfur atom, a phosphorus atom, and a silicon atom.

Specific examples of the alkyl group include a methyl group, an ethyl group, an n-propyl group, an i-propyl group, an n-butyl group, an i-butyl group, a sec-butyl group, a t-butyl group, a pentyl group, an isopentyl group, a neopentyl group, a hexyl group, a heptyl group, an octyl group, and a 2-ethylhexyl group. Specific examples of the cycloalkyl group include a cyclopentyl group, a cyclohexyl group, a cycloheptyl group, and a 2-methylcyclohexyl group. Examples of the alkenyl group include a vinyl group, an allyl group, and an isopropenyl group. Specific examples of the cycloalkenyl group include a cyclohexenyl group.

Specific examples of the 2-methylene-1,3-dicarbonyl compound include dibutyl methylene malonate, dipentyl methylene malonate, dihexyl methylene malonate, dicyclohexyl methylene malonate, ethyl octyl methylene malonate, propyl hexyl methylene malonate, 2-ethylhexyl-ethyl methylene malonate, ethylphenyl-ethyl methylene malonate and the like. These are preferable because of their low volatility and high reactivity. From the perspective of handleability, dihexyl methylene malonate and dicyclohexyl methylene malonate are particularly preferable.

As used herein, a spacer refers to a divalent hydrocarbon group, more specifically a cyclic, linear or branched, substituted or unsubstituted alkylene. There are no particular restrictions on the carbon number of the alkylene. The carbon number of the alkylene group is usually 1 to 12, preferably 2 to 10, more preferably 3 to 8, and still more preferably 4 to 7. If desired, the alkylene may comprise a group comprising a heteroatom selected from N, O, S, P, and Si. The alkylene may have an unsaturated bond. In an embodiment, the spacer is an unsubstituted alkylene having 4 to 7 carbon atoms.

If the 2-methylene-1,3-dicarbonyl compound has a spacer, the number of carbon atoms in the terminal monovalent hydrocarbon group is preferably 6 or less. That is, when the 2-methylene-1,3-dicarbonyl compound is represented by formula (II) or (IV) above, it is preferable that $R^4$ in formula (III) or (V) above be alkyl having 1 to 6 carbon atoms, provided that if either one of $R^1$ and $R^2$ is represented by formula (III) or formula (V) above, it is preferable that the other of $R^1$ and $R^2$ be alkyl having 1 to 6 carbon atoms. In this case, in formula (II) or formula (IV) above, both $R^1$ and $R^2$ may be represented by formula (III) or formula (V) above, and preferably, only one of $R^1$ and $R^2$ is represented by formula (III) or formula (V) above. Preferably, the 2-methylene-1,3-dicarbonyl compound is represented by formula (IV) above.

Particularly preferable compounds include compounds represented by formula (IV) above, wherein either one of $R^1$ and $R^2$ is any one of an ethyl group, an n-hexyl group or a cyclohexyl group, the other is represented by formula (V) above, W is a butyl group or a cyclohexyl group, and $R^4$ is an ethyl group, an n-hexyl group or a cyclohexyl group. Further, other particularly preferable compounds include compounds represented by formula (IV) above, wherein $R^1$ and $R^2$ are represented by formula (V) above, W is either a butyl group or cyclohexyl group, and $R^4$ is any one of an ethyl group, an n-hexyl group or a cyclohexyl group.

2-Methylene-1,3-dicarbonyl compounds having various molecular weights are available from Sirrus Inc., Ohio, USA, and synthetic methods thereof are disclosed in publications of patent applications such as WO2012/054616, WO2012/054633 and WO2016/040261. If both ends of the structural unit represented by formula (I) above contained in the 2-methylene-1,3-dicarbonyl compound are bonded to oxygen atoms, 2-methylene-1,3-dicarbonyl compounds having a higher molecular weight in which a plurality of structural units represented by formula (I) above are liked via an ester bond and the spacer above can be produced by using methods known in the art such as the transesterification with a diol or a polyol disclosed in Japanese Translation of PCT International Application Publication No. JP-T-2015-518503. A 2-methylene-1,3-dicarbonyl compound thus prepared may comprise a hydroxy group in $R^1$ and $R^2$ in formula (II) or formula (IV) above, $R^4$ in formula (III) or formula (V) above, and $R^{14}$ and $R^{13}$ in formula (VI) above. The resin composition of the present invention comprising a 2-methylene-1,3-dicarbonyl compound(s) having a molecular weight of 220 to 10,000 and wherein the amount by weight of 2-methylene-1,3-dicarbonyl compound(s) having a molecular weight of less than 220 is in a certain range can be obtained by combining these 2-methylene-1,3-dicarbonyl compounds having various molecular weights in an appropriate manner.

The resin composition of the present invention may comprise, if necessary, the following components in addition to the 2-methylene-1,3-dicarbonyl compound.

Component (A): Inorganic Filler

The resin composition of the present invention may comprise an inorganic filler as component (A). Examples of the inorganic filler of component (A) include silica fillers such as colloidal silica, hydrophobic silica, fine silica, and nanosilica; metal oxides such as calcium carbonate, alumina, and zinc oxide; metals such as nickel, copper, and silver; acrylic beads, glass beads, urethane beads, bentonite, acetylene black, Ketjen black, and the like. Among these, silica filler is preferable because it is conducive to high filler content. The inorganic filler of component (A) may be subjected to surface treatment with a silane coupling agent or the like. A filler that has been subjected to surface treatment is expected to have an effect of preventing filler aggregation. The inorganic filler of component (A) may be used alone or in combination of two or more types.

In addition, the average particle diameter (the average maximum diameter, if not granular) of the inorganic filler of component (A) is preferably, but is not limited to, 0.01 to 50 µm for ease of dispersing the filler uniformly in the resin composition, and for other reasons such as excellent injectability for when the resin composition is used as an adhesive or a liquid sealing material such as an underfill. In addition, it is more preferable that the average particle diameter of component (A) is 0.6 to 10 µm for the purposes of protecting copper wire from the thermal stress of the cured resin composition. Commercial products include high-purity synthetic spherical silicas manufactured by Admatechs (product name: SE5200SEE, average particle diameter: 2 µm; product name: SO-E5, average particle diameter: 2 µm; product name: SO-E2, average particle diameter: 0.6 µm), a silica manufactured by Tatsumori (product name: FB7SDX, average particle diameter: 10 µm), a silica manufactured by Micron (product name: TS-10-034P, average particle diameter: 20 µm), and the like. The average particle diameter of the inorganic filler is measured by a Nanotrac dynamic light scattering particle size analyzer.

The amount of the inorganic filler of component (A) is preferably 20 to 65 parts by weight, more preferably 30 to 60 parts by weight, and more preferably 30 to 40 parts by weight, based on 100 parts by weight of the total components of the resin composition. If the amount is 20 to 65 parts by weight, it can lower the linear expansion coefficient of the resin composition and prevent deterioration in injectability, when the resin composition is used as a liquid sealing material such as an underfill.

Component (B): Curing Catalyst

The resin composition of the present invention may comprise a curing catalyst as component (B). The curing catalyst of component (B) is expected to act as a catalyst when the resin composition is cured by the Michael addition reaction. Examples of curing catalysts that can be used for component (B) include, but are not limited to, an acidic catalyst such as p-toluenesulfonic acid; an amine such as triethylamine, pyridine, and tributylamine; an imidazole compound such as methylimidazole and phenylimidazole; and a phosphorus-based catalyst such as triphenylphosphine. In some embodiments, the curing catalyst of component (B) is desirably a base catalyst, preferably triethylamine.

The curing catalyst of component (B) may be used alone or in combination of two or more types.

The curing catalyst of component (B) may be a latent curing catalyst such as a microcapsule or those based on ion dissociation or an inclusion compound; a solid that generates a base or a radical on exposure to heat, light, electromagnetic waves, ultrasonic waves, or physical shear; or the like. The resin composition of the present invention can also be used as a two-part adhesive.

The amount of the curing catalyst of component (B), in terms of the amount of active ingredient such as an amine compound, is preferably from 0.001 to 10 parts by weight, more preferably from 0.01 to 1 part by weight, and even more preferably from 0.025 to 0.50 parts by weight, based on the total 100 parts by weight of all the components of the resin composition.

The resin composition of the present invention can be used for adhesion onto a substrate. In this case, when the substrate has chemically basic attributes, the resin composition can be cured by the bases on the surface of the substrate even if the resin composition does not comprise a curing catalyst of component (B).

Component (C): Stabilizer

The resin composition of the present invention may comprise a (C) stabilizer.

The (C) stabilizer is for enhancing the stability of the resin composition during storage, and is added to suppress the occurrence of unintended polymerization reactions due to radicals or basic components. The 2-methylene-1,3-dicarbonyl compound may generate radicals by itself with a low probability, and these radicals may act as a starting point to trigger an unintended radical polymerization reaction. Also, the 2-methylene-1,3-dicarbonyl compound may undergo anionic polymerization reactions due to the presence of very small amounts of basic impurities. The occurrence of such unintended polymerization reactions due to radicals or basic impurities can be suppressed by adding a (C) stabilizer.

Stabilizers known in the art can be used for the (C) stabilizer, and for example, a strong acid or a radical scavenger can be used. Specific examples of the (C) stabilizer include trifluoromethanesulfonic acid, maleic acid, methanesulfonic acid, difluoroacetic acid, trichloroacetic acid, phosphoric acid, dichloroacetic acid, N-nitroso-N-phenylhydroxylamine aluminum, triphenylphosphine, 4-methoxyphenol, and hydroquinone. Among these, preferable (C) stabilizers are at least one selected from maleic acid, methanesulfonic acid, N-nitroso-N-phenylhydroxylamine aluminum and 4-methoxyphenol. Stabilizers known in the art such as those disclosed in JP 2010-117545 A and JP 2008-184514 A can also be used for the (C) stabilizer.

The (C) stabilizer may be used alone or in combination of two or more types.

Component (D): Interface Treatment Agent

The resin composition of the present invention may comprise an (D) interface treatment agent.

There are no particular limitations on the (D) interface treatment agent, but typically, a coupling agent can be used. A coupling agent has two or more different functional groups within the molecule, one of which is a functional group that chemically bonds to an inorganic material and the other of which is a functional group that chemically bonds to an organic material. If an adhesive comprises a coupling agent, the adhesion of the adhesive to a circuit board or the like is improved.

Examples of coupling agents include, but are not limited to, silane coupling agents, aluminum coupling agents, titanium coupling agents and the like. One type of coupling agent may be used, or two or more types may be used in combination.

Examples of functional groups possessed by silane coupling agents include a vinyl group, an epoxy group, a styryl group, a methacrylic group, an acrylic group, an amino group, an isocyanurate group, a ureide group, a mercapto group, a sulfide group, an isocyanate group, and the like.

Component (E): Pigment

The resin composition of the present invention may comprise an (E) pigment.

The chromaticity of the resin composition of the present invention can be adjusted by incorporation of an (E) pigment. Examples of (E) pigments that can be used include, but are not limited to, carbon black, titanium black such as titanium nitride, a black organic pigment, a mixed color organic pigment, an inorganic pigment and the like. Examples of the black organic pigment include perylene black, aniline black, and the like; examples of the mixed color organic pigment include those obtained by mixing at least two kinds of pigments selected from red, blue, green, purple, yellow, magenta, cyan, and the like to obtain a pseudo-black color; and examples of the inorganic pigment include graphite, fine metal particles of titanium, copper, iron, manganese, cobalt, chromium, nickel, zinc, calcium, silver, and the like, metal oxides, complex oxides, metal sulfides, metal nitrides, and the like. These may be used alone or as a mixture of two or more kinds. The (E) pigment is preferably carbon black or titanium black.

Component (F): Plasticizer

The resin composition of the present invention may comprise an (F) plasticizer.

For the (F) plasticizer, any plasticizer known in the art can be combined. The (F) plasticizer can improve formability or adjust glass transition temperature. For the (F) plasticizer, plasticizers having good compatibility and that do not easily bleed can be used.

Examples of (F) plasticizers are phthalic acid esters such as di-n-butyl phthalate, di-n-octyl phthalate, bis(2-ethylhexyl) phthalate, di-n-decyl phthalate, and diisodecyl phthalate; adipic acid esters such as bis(2-ethylhexyl) adipate and di-n-octyl adipate; sebacic acid esters such as bis(2-ethylhexyl) sebacate, and di-n-butyl sebacate; azelaic acid esters such as bis(2-ethylhexyl) azelate; paraffins such as chlorinated paraffins; glycols such as polypropylene glycol; epoxy-modified vegetable oils such as epoxidized soybean oil and epoxidized linseed oil; phosphate esters such as trioctyl phosphate and triphenyl phosphate; phosphite esters such as triphenyl phosphite; ester oligomers such as esterified products of adipic acid and 1,3-butylene glycol; low molecular weight polymers such as low molecular weight polybutene, low molecular weight polyisobutylene and low molecular weight polyisoprene; oils such as process oils and naphthenic oils; and the like.

The (F) plasticizer may be used alone or in combination of two or more types.

The resin composition of the present invention may comprise components (A) to (F), as necessary, in addition to the 2-methylene-1,3-dicarbonyl compound. The resin composition of the present invention can be prepared by mixing these components. Apparatuses known in the art can be used for mixing. For example, mixing can be performed by apparatuses known in the art such as a Henschel mixer or a roll mill. These ingredients may be mixed simultaneously, or it may be such that some are mixed first, and the remainder are mixed later.

Vapor Pressure

The 2-methylene-1,3-dicarbonyl compounds contained in the resin composition of the present invention preferably have a vapor pressure of 0.01 mmHg or lower at 25° C. In an embodiment, the amount by weight of those 2-methylene-1,3-dicarbonyl compounds having a vapor pressure of 0.01 mmHg or more at 25° C. relative to the entire resin composition of the present invention of 1 is preferably 0.00 to 0.05, more preferably 0.00 to 0.03, and even more preferably 0.00 to 0.01. In another embodiment, the amount by weight of those 2-methylene-1,3-dicarbonyl compounds having a vapor pressure of 0.01 mmHg or more at 25° C. relative to the totality of the 2-methylene-1,3-dicarbonyl compounds contained in the resin composition of the present invention of 1 is preferably 0.00 to 0.05, more preferably 0.00 to 0.03, and even more preferably 0.00 to 0.01.

When the resin composition of the present invention is used at a higher temperature, for example, 50° C., the 2-methylene-1,3-dicarbonyl compounds contained in the resin composition of the present invention more preferably have a vapor pressure of 0.001 mmHg or lower at 25° C. In this case, in an embodiment, the amount by weight of those 2-methylene-1,3-dicarbonyl compounds having a vapor pressure of 0.001 mmHg or more at 25° C. relative to the entire resin composition of the present invention of 1 is preferably 0.00 to 0.05, more preferably 0.00 to 0.03, and even more preferably 0.00 to 0.01. In another embodiment, the amount by weight of those 2-methylene-1,3-dicarbonyl compounds having a vapor pressure of 0.001 mmHg or more at 25° C. relative to the totality of the 2-methylene-1,3-dicarbonyl compounds contained in the resin composition of the present invention of 1 is preferably 0.00 to 0.05, more preferably 0.00 to 0.03, and even more preferably 0.00 to 0.01.

When the resin composition of the present invention is used at an even higher temperature, for example, 80° C., the 2-methylene-1,3-dicarbonyl compounds contained in the resin composition of the present invention more preferably have a vapor pressure of 0.0001 mmHg or lower at 25° C. In this case, in an embodiment, the amount by weight of those 2-methylene-1,3-dicarbonyl compounds having a vapor pressure of 0.0001 mmHg or more at 25° C. relative to the entire resin composition of the present invention of 1 is preferably 0.00 to 0.05, more preferably 0.00 to 0.03, and even more preferably 0.00 to 0.01. In another embodiment, the amount by weight of those 2-methylene-1,3-dicarbonyl compounds having a vapor pressure of 0.0001 mmHg or more at 25° C. relative to the totality of the 2-methylene-1,3-dicarbonyl compounds contained in the resin composition of the present invention of 1 is preferably 0.00 to 0.05, more preferably 0.00 to 0.03, and even more preferably 0.00 to 0.01.

The resin composition of the present invention has a vapor pressure at 25° C. of 0.01 mmHg or lower, more preferably 0.001 mmHg or lower, and still more preferably 0.0001 mmHg or lower.

In the present invention, the vapor pressure of a compound such as the 2-methylene-1,3-dicarbonyl compound is estimated by the Y-MB method using the commercially available software HSPiP (4th Edition Apr. 1, 2005).

The resin composition of the present invention may comprise components other than the 2-methylene-1,3-dicarbonyl compound or (A) to (F) above, such as, for example, a flame retardant, an ion trapper, an antifoaming agent, a levelling agent, a foam breaker, etc. as long as they do not impair the effectiveness of the present invention.

The resin composition of the present invention can be used as an adhesive or a sealing material. Specifically, the resin composition of the present invention is suitable for adhesion and sealing for electronic components. More specifically, the resin composition of the present invention can be used for adhesion and sealing of components for camera modules, and is particularly suitable for adhesion of image sensor modules. This is because the resin composition of the present invention only has a very small amount of volatile components that contaminate the surroundings, and it therefore does not easily lead to the generation of adhered substances (solids). In the present invention, an electronic component adhered using the resin composition of the present invention is also provided. Further, an electronic component sealed using the resin composition of the present invention is also provided.

FIG. 1 illustrates a camera module 10 including a lens 12, a voice coil motor 14, a lens unit 16, a support 18, an IR cut filter 20, an image sensor 22, and a printed circuit board 24. As shown in FIG. 1, the resin composition of the present invention, for example, can be used as adhesive 30 to adhere the IR cut filter 20 to the printed circuit board 24. The resin composition of the present invention can also be used as adhesive 32 to adhere the image sensor 22 to the printed circuit board 24. The resin composition of the present invention can also be used as adhesive 34 to adhere the support 18 to the printed circuit board 24. A jet dispenser, an air dispenser, or the like can be used to supply the resin composition to the adherend surface. The resin composition of the present invention can be cured at room temperature without heating. The resin composition of the present invention can also be cured by heating at a temperature of 25 to 80° C., for example. The heating temperature is preferably 50 to 80° C. The heating time is, for example, 0.5 to 4 hours.

The resin composition of the present invention can also be used for an image sensor module other than a camera module. For example, it can be used for adhesion and sealing of components of an image sensor module that may be incorporated in a fingerprint authentication device, a face authentication device, a scanner, a medical device, or the like.

The resin composition of the present invention can also be used as a constituent material of a film or a prepreg. In particular, the resin composition of the present invention is suitable as a constituent material of a coverlay film for protecting wiring patterns, an interlayer adhesive film for a multilayer wiring substrate, and a prepreg. This is because the resin composition of the present invention only has a very small amount of volatile components, and it therefore does not easily lead to the generation of voids. The film or prepreg comprising the resin composition of the present invention, preferably, can be used for electronic components.

The prepreg comprising the resin composition of the present invention can be produced by methods known in the art, for example, a hot melt method or a solvent method. When a hot melt method is used, a prepreg can be produced without dissolving the resin composition of the present invention in an organic solvent, for example, by temporarily coating a release paper having good release properties against the resin composition of the present invention with the resin composition and then laminating it on a sheet-like fiber substrate, or by directly applying a coating using a die coater. When a solvent method is used, a sheet-like fiber substrate is first immersed in a resin composition varnish prepared by dissolving the resin composition of the present invention in an organic solvent, thereby impregnating the resin composition varnish into the sheet-like fiber substrate, and then the sheet-like fiber substrate is dried to obtain a prepreg.

The film comprising the resin composition of the present invention can be obtained from the resin composition of the present invention by methods known in the art. For example, the resin composition of the present invention can be diluted with a solvent to form a varnish, which is applied to at least one side of a support, dried, and then provided as a film with a support or as a film detached from the support.

The present invention also provides a cured product obtained by curing the resin composition of the present invention. The present invention also provides a cured product obtained by curing an adhesive or a sealing material comprising the resin composition of the present invention, and a cured product obtained by curing a film or a prepreg comprising the resin composition of the present invention.

Furthermore, the present invention also provides a semiconductor device comprising the cured product of the present invention, the cured product of the adhesive or the sealing material of the present invention, or the cured product of the film or the prepreg of the present invention.

The present invention also provides a method for adhering a member to be incorporated in an electronic component, the method comprising applying the resin composition of the present invention to a member to be incorporated in an electronic component and adhering it to another member to be incorporated in the electronic component. The electronic component is preferably a component for a camera module, more preferably an image sensor module. Also provided is a method for adhering or sealing an electronic component or a semiconductor element on a circuit board, the method comprising applying or injecting the resin composition of the present invention. Further provided is a method for sealing an electronic circuit, the method comprising applying the resin composition of the present invention onto an electronic circuit formed on a circuit board.

The present invention also provides a method for producing an electronic component, the method comprising: providing a plurality of members to be incorporated in an electronic component; applying the resin composition of the present invention on the surface of a member to be incorporated in the electronic component; and contacting the member with another member to be incorporated in the electronic component. The above-mentioned method for producing an electronic component may further comprise heating and curing the resin composition at a temperature of 25 to 80° C. for 0.5 to 4 hours after contacting the members.

The present invention also provides a method for producing a member to be incorporated in an electronic component, the method comprising providing a circuit board comprising an electronic circuit and applying the resin composition of the present invention onto the electronic circuit on the circuit board. The above-mentioned method for producing a member to be incorporated in an electronic component may further comprise heating and curing the resin composition at a temperature of 25 to 80° C. for 0.5 to 4 hours after applying the resin composition. The above-mentioned method for manufacturing a member to be incorporated in an electronic component may further comprise sealing the electronic circuit by heating and curing the resin composition at a temperature of 25 to 80° C. for 0.5 to 4 hours after applying the resin composition.

Preferable embodiments of the method for producing an electronic component and the method for producing a member to be incorporated in an electronic component mentioned above are the same as for when the resin composition of the present invention is used as an adhesive. In these methods, the electronic component is preferably a component for a camera module, more preferably an image sensor module.

The present invention also further provides a method for adhering an electronic component to a circuit board comprising: (1) providing an electronic component and a circuit board; (2) applying the resin composition of the present invention on the surface of the electronic component or the circuit board; and (3) contacting the electronic component and the circuit board.

The present invention also provides a method for producing a semiconductor device comprising: (1) providing an electronic component and a circuit board; (2) applying the resin composition of the present invention to the surface of the electronic component or the circuit board; and (3) contacting the electronic component and the circuit board. The above-mentioned method for producing a semiconductor device may further comprise heating and curing the resin composition at a temperature of 25 to 80° C. for 0.5 to 4 hours after contacting the electronic component and the circuit board.

Preferable embodiments of the method for adhering an electronic component to a circuit board and the method for producing a semiconductor device mentioned above are the same as for when the resin composition of the present invention is used as an adhesive.

The present invention also provides a method for sealing an electronic component comprising: (1) providing an electronic component; and (2) sealing the electronic component using the resin composition of the present invention.

The present invention further provides a method for producing a sealed electronic component, comprising: (1) providing an electronic component; and (2) sealing the electronic component using the resin composition of the present invention. The above-mentioned method for producing a sealed electronic component may further comprise heating and curing the resin composition at a temperature of 25 to 80° C. for 0.5 to 4 hours after sealing the electronic component.

Preferable embodiments of the method for sealing an electronic component and the method for producing a sealed electronic component mentioned above are the same as for when the resin composition of the present invention is used as a sealing material.

Examples

Examples and comparative examples of the present invention will be described below. The present invention is not limited to the following Examples and Comparative Examples. In the following Examples and Comparative Examples, the proportions of components contained in adhesives are given in parts by weight.

Calculating Vapor Pressures

Vapor pressures at various temperatures were calculated for several embodiments of the 2-methylene-1,3-dicarbonyl compound used in the present invention, using the HSPiP (4th Edition 4.1.05, Y-MB method). Table 1 shows the vapor pressures (unit: mmHg) at various temperatures for dimethyl methylene malonate (DMeMM), diethyl methylene malonate (DEtMM), dipropyl methylene malonate (DPrMM), dibutyl methylene malonate (DBtMM), dipentyl methylene malonate (DPeMM), dihexyl methylene malonate (DHeMM), dicyclohexyl methylene malonate (DCHeMM), and pentanediol diethyl methylene malonate (PD-XL). Table 1 also shows the same for the acrylate resins used as comparisons (phenyl acrylate, phenoxyethyl acrylate (PO-A), and dimethylol-tricyclodecane diacrylate (DCP-A)).

TABLE 1

| Sample | Molecular weight | Temperature [° C.] | | | | | |
|---|---|---|---|---|---|---|---|
| | | 25 | 50 | 80 | 100 | 120 | 150 |
| DMeMM | 144.1 | 0.3587 | 2.3814 | 14.3900 | 38.6500 | 91.1600 | 272.4000 |
| DEtMM | 172.2 | 0.0899 | 0.7313 | 5.3007 | 15.6700 | 40.0500 | 132.2000 |
| DPrMM | 200.2 | 0.0170 | 0.1757 | 1.5970 | 5.3054 | 14.9500 | 55.5300 |
| DBuMM | 228.3 | 0.0012 | 0.0200 | 0.2706 | 1.1013 | 3.6675 | 16.6600 |
| DPeMM | 256.3 | 0.0001 | 0.0017 | 0.0367 | 0.1867 | 0.7465 | 4.2143 |
| DHeMM | 284.4 | 0.0000 | 0.0003 | 0.0077 | 0.0463 | 0.2116 | 1.4038 |
| DCHeMM | 280.4 | 0.0000 | 0.0001 | 0.0019 | 0.0120 | 0.0587 | 0.4234 |
| PD-XL | 356.4 | 0.0000 | 0.0000 | 0.0000 | 0.0001 | 0.0007 | 0.0144 |
| Phenyl acrylate | 148.2 | 0.0760 | 0.5983 | 4.2146 | 12.3100 | 31.2300 | 102.3000 |
| PO-A | 192.2 | 0.0010 | 0.0152 | 0.2037 | 0.8277 | 2.7607 | 12.6100 |
| DCP-A | 304.4 | 0.0000 | 0.0000 | 0.0003 | 0.0023 | 0.0132 | 0.1184 |

Table 1 reveals that 2-methylene-1,3-dicarbonyl compounds having a molecular weight of 220 or more have low vapor pressures, in particular, vapor pressures of approximately 0.01 mmHg or less at 25° C. Little volatilization occurs when a 2-methylene-1,3-dicarbonyl compound having a vapor pressure of 0.01 mmHg or less at 25° C. is cured at room temperature, causing little contamination of neighboring components.

Preparing Adhesives

The raw materials for the adhesives used in the following Examples and Comparative Examples are as follows.

2-Methylene-1,3-dicarbonyl compound: DEtMM (manufactured by Sirrus Inc., $R^1$=$R^2$=$C_2H_5$ in formula (IV) above), DHeMM (manufactured by Sirrus Inc., $R^1$=$R^2$=n-$C_6H_{13}$ in formula (IV) above), PD-XL (manufactured by Sirrus Inc., $R^1$=$C_2H_5$, $R^2$=formula (V) above, W=—$(CH_2)_5$—, and $R^4$=$C_2H_5$ in formula (IV) above)

(A) Inorganic filler: SE5200SEE (manufactured by Admatechs)

(B) Curing catalyst: Triethylamine (manufactured by Wako Pure Chemical Industries, Ltd.)

In some of the Comparative Examples, phenyl acrylate (manufactured by Tokyo Chemical Industries Co., Ltd.), phenoxyethyl acrylate (PO-A, manufactured by Kyoeisha Chemical Co., Ltd.) or dimethylol-tricyclodecane diacrylate (DCP-A, manufactured by Kyoeisha Chemical Co., Ltd.) was used instead of the above-mentioned 2-methylene-1,3-dicarbonyl compound.

Adhesives were prepared by mixing 2-methylene-1,3-dicarbonyl compounds or acrylates, and optionally, components (A) to (B) in the proportions shown in Tables 2 and 3. The following characteristics were measured for the adhesives prepared.

1. Evaluation of Adhered Substance 0.05 g of an adhesive was placed in an aluminum pan (diameter: 5 mm, height: 5 mm), and a cover glass (18×18 mm) was placed so as to cover the entire upper opening. After it was left to stand at the curing temperature indicated in Table 2 or 3 for 12 hours, visual inspection and palpation with tweezers were carried out to determine the presence or absence of adhered substance on the cover glass and, if present, whether the adhered substance was liquid or solid.

2. Evaluation of Adhesion Strength

An adhesive was applied spot-wise on an SUS plate so as to have a diameter of about 2 mm, and a 2×1 mm alumina chip was placed thereon. After it was left to stand at the curing temperature indicated in Table 2 or 3 for 12 hours, the adhesion strength was evaluated at 25° C. with a bond tester (Series 4000, manufactured by Dage Ltd.).

TABLE 2

| Sample name | Molecular weight | Number of functional groups | Example 1 | Example 2 | Example 3 | Comparative Example 1 | Comparative Example 2 | Comparative Example 3 |
|---|---|---|---|---|---|---|---|---|
| DHeMM | 284.4 | 1 | 100 | 95 | 90 | 0 | 0 | 0 |
| PD-XL | 356.4 | 2 | 0 | 5 | 10 | 0 | 0 | 0 |
| PO-A | 192.2 | 1 | 0 | 0 | 0 | 100 | 100 | 0 |
| DCP-A | 304.4 | 2 | 0 | 0 | 0 | 0 | 0 | 100 |
| DEtMM | 172.2 | 1 | 0 | 0 | 0 | 0 | 0 | 0 |
| Phenyl acrylate | 148.2 | 1 | 0 | 0 | 0 | 0 | 0 | 0 |
| SE5200SEE | | | 0 | 0 | 0 | 0 | 0 | 0 |
| Triethylamine | | | 2.00 | 2.00 | 2.00 | 2.00 | 2.00 | 2.00 |
| Curing temperature [° C.] | | | 25 | 25 | 25 | 25 | 80 | 25 |
| Adhesion strength [N/chip] | | | 3.2 | 4.3 | 5.7 | 0 | 0 | 0 |
| Adhered substance | | | Not present | Not present | Not present | Not present | Liquid | Not present |

Discussion on Results

The monofunctional 2-methylene-1,3-dicarbonyl compound DHeMM (Example 1) and examples in which it was partially replaced by the bifunctional PD-XL (Examples 2 and 3) cured at 25° C. and exhibited satisfactory adhesion strength. In particular, Examples 2 and 3, comprising the bifunctional PD-XL, showed higher adhesion strengths than Example 1. No apparent adhered substance was observed in any of them.

In the formulations used, the monofunctional acrylate resin PO-A, an acrylate resin widely and popularly used as adhesives, did not cure at either 25° C. or 80° C., and exhibited no adhesion strength (Comparative Examples 1 and 2). No apparent adhered substance was visible for 25° C., while a liquid adhered substance was observed for 80° C.

DCP-A, a bifunctional acrylate resin, did not cure at 25° C. and exhibited no adhesion strength, either (Comparative Example 3).

tweezers confirmed that the adhered substance was solid (Comparative Examples 4 and 5).

DHeMM exhibited satisfactory adhesion strength even when the amount of catalyst was reduced, and no adhered substance was observed (Example 5).

DHeMM exhibited satisfactory adhesion strength even when a filler was combined and no adhered substance was observed (Examples 6 and 7).

Phenyl acrylate, a monofunctional acrylate resin, did not cure and exhibited no adhesive strength, and furthermore, a liquid adhered substance was also observed (Comparative Example 6).

The above demonstrates that acrylate resins, which are widely and popularly used as adhesives, do not cure and cannot be used as an adhesive at 25° C. It has also been found that even adhesives comprising a 2-methylene-1,3-dicarbonyl compound leave adhered substance in the surroundings and are not suitable for a one-part adhesive used in the manufacture of an image sensor module or an elec-

TABLE 3

| Sample name | Molecular weight | Example 4 | Comparative Example 4 | Comparative Example 5 | Example 5 | Example 6 | Example 7 | Comparative Example 6 |
|---|---|---|---|---|---|---|---|---|
| DHeMM | 284.4 | 95 | 90 | 0 | 100 | 90 | 80 | 0 |
| PD-XL | 356.4 | 0 | 0 | 0 | 0 | 0 | 0 | 0 |
| PO-A | 192.2 | 0 | 0 | 0 | 0 | 0 | 0 | 0 |
| DCP-A | 304.4 | 0 | 0 | 0 | 0 | 0 | 0 | 0 |
| DEtMM | 172.2 | 5 | 10 | 100 | 0 | 0 | 0 | 0 |
| Phenyl acrylate | 148.2 | 0 | 0 | 0 | 0 | 0 | 0 | 100 |
| SE5200SEE | | 0 | 0 | 0 | 0 | 10 | 20 | 0 |
| Triethylamine | | 2.00 | 2.00 | 0.25 | 1.00 | 2.00 | 2.00 | 2.00 |
| Curing temperature [° C.] | | 25 | 25 | 25 | 25 | 25 | 25 | 25 |
| Adhesion strength [N/chip] | | 3.5 | 3.8 | 32.8 | 2.9 | 3.6 | 3.9 | 0 |
| Adhered substance | | Not present | Solid | Solid | Not present | Not present | Not present | Liquid |

Discussion on Results

In the example in which DEtMM, a monofunctional 2-methylene-1,3-dicarbonyl compound having high vapor pressure, was combined in an amount of approximately 5% by weight, no apparent adhered substance was observed, and satisfactory adhesion strength was exhibited upon curing (Example 4).

In the examples in which DEtMM was combined in an amount of about 10% by weight or more, satisfactory adhesion strength was still exhibited upon curing, but an unmistakable frost was observed on the cover glass during the evaluation of adhered substance, and palpation with tronic component, if the adhesives do not comprise at least one 2-methylene-1,3-dicarbonyl compound having a molecular weight of 220 to 10,000, or if the amount by weight of those 2-methylene-1,3-dicarbonyl compounds having a molecular weight of less than 220 relative to the entire resin composition of 1 is not 0.00 to 0.05 (the same also applies to cases in which the totality of the 2-methylene-1,3-dicarbonyl compounds is taken as 1).

In sum, the Comparative Examples have the problems of not being able to cure at low temperatures and/or leaving adhered substance in the surroundings upon curing; by contrast, only the Examples of the present invention are suitable for a one-part adhesive used in the manufacture of an image sensor module or an electronic component because they are able to cure at low temperatures and, at the same time, do not leave adhered substance in the surroundings upon curing.

The present application claims priority to Japanese Patent Application No. 2017-098918, filed May 18, 2017, the entire contents of which are expressly incorporated herein by this reference.

REFERENCE SIGNS LIST

10 Camera module
12 Lens
14 Voice coil motor
16 Lens unit
18 Support
20 Cutting filter
22 Image sensor
24 Printed circuit board
30, 32, 34 Adhesive

What is claimed is:

1. A resin composition comprising one or more 2-methylene-1,3-dicarbonyl compounds, wherein:
   at least one of the one or more 2-methylene-1,3-dicarbonyl compounds has a molecular weight of 220 to 10,000;
   an amount by weight of 2-methylene-1,3-dicarbonyl compounds having a molecular weight of less than 220 relative to a totality of the 2-methylene-1,3-dicarbonyl compounds is 0.00 to 0.05, with an amount by weight of the totality of the 2-methylene-1,3-dicarbonyl compounds being 1; and
   the one or more 2-methylene-1,3-dicarbonyl compounds comprise a structural unit represented by formula (I):

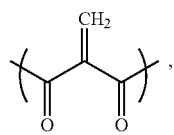

(I)

wherein the resin composition comprises at least one 2-methylene-1,3-dicarbonyl compound comprising two or more structural units represented by formula (I) and at least one 2-methylene-1,3-dicarbonyl compound having only one structural unit represented by formula (I); and
wherein an amount by weight of the at least one 2-methylene-1,3-dicarbonyl compound comprising two or more structural units represented by formula (I) relative to the totality of the 2-methylene-1,3-dicarbonyl compounds is 0.05 to 0.95, with the amount by weight of the totality of the 2-methylene-1,3-dicarbonyl compounds being 1.

2. The resin composition according to claim 1, substantially free of any 2-methylene-1,3-dicarbonyl compounds having a molecular weight of less than 220.

3. The resin composition according to claim 1, wherein the one or more 2-methylene-1,3-dicarbonyl compounds are represented by formula (II):

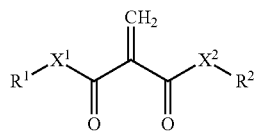

(II)

wherein:
$X^1$ and $X^2$ each, independently, represent a single bond, O or $NR^3$, wherein $R^3$ represents hydrogen or a monovalent hydrocarbon group; and
$R^1$ and $R^2$ are each, independently, hydrogen, a monovalent hydrocarbon group, or represented by formula (III):

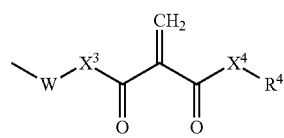

(III)

wherein:
$X^3$ and $X^4$ each, independently, represent a single bond, O or $NR^5$, wherein $R^5$ represents hydrogen or a monovalent hydrocarbon group;
W represents a spacer; and
$R^4$ represents hydrogen or a monovalent hydrocarbon group.

4. The resin composition according to claim 1, further comprising (A) an inorganic filler.

5. The resin composition according to claim 1, further comprising (B) a curing catalyst.

6. The resin composition according to claim 1, further comprising (C) a stabilizer.

7. The resin composition according to claim 1, wherein an amount by weight of the one or more 2-methylene-1,3-dicarbonyl compounds relative to the resin composition is 0.01 to 1.00.

8. The resin composition according to claim 1, wherein an amount by weight of one or more 2-methylene-1,3-dicarbonyl compounds having a vapor pressure of 0.01 mmHg or more at 25° C. relative to the totality of the 2-methylene-1,3-dicarbonyl compounds is 0.00 to 0.05, with the amount by weight of the totality of the 2-methylene-1,3-dicarbonyl compounds being 1.

9. The resin composition according to claim 1, wherein the resin composition is curable by heat.

10. A cured product obtained by curing the resin composition according to claim 1.

11. An adhesive or sealing material comprising the resin composition according to claim 1.

12. A semiconductor device comprising a cured product of the adhesive or sealing material according to claim 11.

13. A film or prepreg comprising the resin composition according to claim 1.

14. A semiconductor device comprising a cured product of the film or prepreg according to claim 13.

15. A semiconductor device comprising the cured product according to claim 10.

16. A method for producing a semiconductor device having an electronic component and a circuit board, the method comprising:

providing an electronic component and a circuit board;

applying the resin composition according to claim 1 to the surface of the electronic component or the circuit board; and contacting the electronic component and the circuit board.

17. A method for producing a sealed electronic component, comprising:

providing an electronic component; and sealing the electronic component using the resin composition according to claim 1.

18. A method for producing an electronic component, comprising:

providing a plurality of members to be incorporated in an electronic component;

applying the resin composition according to claim 1 to the surface of a member to be incorporated in the electronic component; and contacting the member with another member to be incorporated in the electronic component.

19. A method for producing a member to be incorporated in an electronic component, comprising:

providing a circuit board comprising an electronic circuit; and applying the resin composition according to claim 1 onto the electronic circuit on the circuit board.

* * * * *